(12) United States Patent
Matsuda et al.

(10) Patent No.: US 6,403,481 B1
(45) Date of Patent: Jun. 11, 2002

(54) FILM FORMATION METHOD

(75) Inventors: Tetsuo Matsuda, Tano-gun; Hisashi Kaneko, Fujisawa, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/371,221

(22) Filed: Aug. 10, 1999

(30) Foreign Application Priority Data

Aug. 11, 1998 (JP) .......................................... 10-227112
Aug. 11, 1998 (JP) .......................................... 10-227113

(51) Int. Cl.[7] ...................... H01L 21/4763; H01L 21/44
(52) U.S. Cl. ...................... 438/687; 438/627; 438/637; 438/641; 438/643; 438/647; 438/653; 438/656; 438/677; 438/678
(58) Field of Search .................... 438/687, 627, 438/660–661, 677–678, 643, 653, 672, 641, 656; 205/102–105, 123; 257/762

(56) References Cited

U.S. PATENT DOCUMENTS 5,897,368 A * 4/1999 Cole, Jr. et al. ............. 438/625
5,968,333 A * 10/1999 Nogami et al. .............. 205/184
6,169,024 B1 * 1/2001 Hussein ....................... 438/627

FOREIGN PATENT DOCUMENTS

JP    11-135504    5/1999

* cited by examiner

Primary Examiner—John F. Niebling
Assistant Examiner—Ha Tran Nguyen
(74) Attorney, Agent, or Firm—Finnegan, Henderson, Farabow, Garrett, & Dunner, L.L.P.

(57) ABSTRACT

A film formation method for manufacture of a semiconductor device includes the steps of forming a first metal film as a continuous film on a substrate, forming a second metal film as discontinuous films on the substrate formed with the first metal film, and forming a third metal film by plating on the substrate formed with the first and second metal films.

15 Claims, 5 Drawing Sheets

FILM FORMATION METHOD

BACKGROUND OF THE INVENTION

The present invention relates to a film formation method and, more particularly, to a method of forming a metal film used in wirings or the like of a semiconductor device.

In the manufacture of a semiconductor integrated circuit, a method of forming a metal wiring by plating has been studied.

When forming a metal film by plating, the metal film is strongly influenced by a liner in the initial stage of film formation. A case will be described wherein a copper film is to be formed in accordance with electroplating by using a titanium nitride film as a liner film. When a 500 nm thick copper film is formed on a 200 nm thick titanium nitride film, the crystal grain size of copper is about 100 nm. The reason why the plating film has a small crystal grain size is supposed to be as follows.

In the initial stage of film formation, a large number of nuclei are formed on the surface of the liner film. Crystal growth of the plating metal is started from these nuclei. Accordingly, mutual crystal growth interferes with each other to reduce the crystal grain size of the metal plating film.

When a metal plating film having a small crystal grain size is used for a wiring or the like, the electromigration resistance degrades since electromigration tends to progress along the grain boundary. Therefore, with the conventional method, it is difficult to form a metal plating film having an excellent electromigration resistance and large crystal grain size.

As a wiring formation process for a semiconductor integrated circuit, a wiring metal filling process (the so-called damascene method) has been used widely. According to this technique, a metal film is filled in a wiring groove (or a wiring groove and a connection hole) formed in an interlayer insulating film, and then an excessive metal film is removed by polishing. Plating is studied as a promising method in the damascene method as well.

A process of forming a copper plating film in the damascene method is as follows. First, a barrier metal film and a copper film are formed in a wiring groove and a connection hole formed in an interlayer insulating film. These films serve as an electric current supplying layer. The electric current supplying layer forms a conductive film for introducing a current during electroplating. After that, a copper film is formed on the electric current supplying layer by electroplating. When forming the copper film on the electric current supplying layer by electroplating, a sufficiently large amount of electrons must be supplied to the plating solution (copper ions in the plating solution) even during the initial stage of electroplating. Hence, the electric current supplying layer has a conductivity to a certain degree or more, in other words, a minimum film thickness.

When the wiring groove or connection hole is micropatterned, the method described above suffers the following problems. Sputtering is generally used to form the electric current supplying layer. Sputtering has poor step coverage. Accordingly, the film thickness decreases near the bottoms of the groove and hole, and overhangs are formed near the upper portions of the groove and hole. When a sufficiently thick electric current supplying layer is to be assured near the bottoms of the groove and hole, the overhangs increase near the upper portions of the groove and hole. When the overhang increases, penetration of the plating solution is interfered with. As a result, a void or seam is formed in the plating film, making it difficult to form a metal plating film having high quality.

When a metal plating film having a void or seam is used for a wiring or the like, the electromigration resistance degrades because electromigration is promoted by the void or seam. Therefore, with the conventional method, it is difficult to form a high-quality metal plating film having good electromigration resistance in a groove or hole.

BRIEF SUMMARY OF THE INVENTION

It is the first object of the present invention to provide a film formation method for the manufacture of a semiconductor device, which can form a metal film having a large crystal grain size to provide good electromigration resistance.

It is the second object of the present invention to provide a film formation method for the manufacture of a semiconductor device, which can form a high-quality metal film in a groove or hole without defects such as void or seam to provide good electromigration resistance.

According to the first aspect of the present invention, there is provided a film formation method for manufacture of a semiconductor device, comprising the steps of: forming a first metal film as a continuous film on a substrate; forming a second metal film as discontinuous films on the substrate formed with the first metal film; and forming a third metal film by plating on the substrate formed with the first and second metal films.

According to the present invention, the second metal film as the discontinuous metal films (from another viewpoint, the second metal film formed as discrete films) serves as nuclei when forming the third metal film. The third metal film preferentially grows from the nuclei. Accordingly, a metal plating film (third metal film) having a large crystal grain size can be formed by controlling the nucleus density. For example, when a metal plating film having a thickness of about 0.1 $\mu$m to 1 $\mu$m is formed, a metal plating film having high quality can be obtained. As a result, the electromigration resistance of the metal film can be improved.

In order to allow the second metal film formed as discrete films to serve as the nuclei in formation of the third metal film, the first, second, and third metal films are preferably made of metal materials selected such that the third metal film is more preferentially formed on the second metal film than on the first metal film.

In particular, the second and third metal films are preferably made of the same metal material. This is because, when the crystal state (the lattice constant and the like) of the metal that forms the third metal film is identical or similar to that of the second metal film, the crystallinity or degree of purity of the third metal film can be improved. When the lattice constants of the metals constituting the two metal films largely differ from each other, the resistivity of the third metal film becomes high, and the resistivity within the substrate surface varies largely.

Discontinuity of the second metal film can be obtained by depositing a metal material on a step portion of the substrate formed with the first metal film. In particular, the metal material is preferably deposited by sputtering.

The method may further comprise a step of causing an alloy reaction between a metal constituting the first metal film and a metal constituting the second metal film prior to formation of the third metal film. This makes it possible to obtain high adhesion strength between the first and second metal films and achieve highly reliable film formation.

As plating for forming the third metal film, electroplating, electrolessplating, substitution plating, and the like can be used. In particular, electroplating or electrolessplating is preferably used. When forming the third metal film by electroplating, the first metal film may be used as an electrode.

The first metal film is preferably formed on the substrate formed with at least one of a groove and a hole.

According to the second aspect of the present invention, there is provided a film formation method for manufacture of a semiconductor device, comprising the steps of: forming a first metal film that serves as a seed in electrolessplating on a substrate formed with at least one of a groove and a hole; forming a second metal film by electrolessplating on the substrate formed with the first metal film; and forming a third metal film by electroplating on the substrate formed with the first and second metal films.

The first, second, and third metal films may be appropriately selected. The first and second metal films are preferably made of the same metal material. Alternatively, the second and third metal films are preferably made of the same metal material. In particular, the first, second, and third metal films are preferably made of the same metal material.

Figure 9:
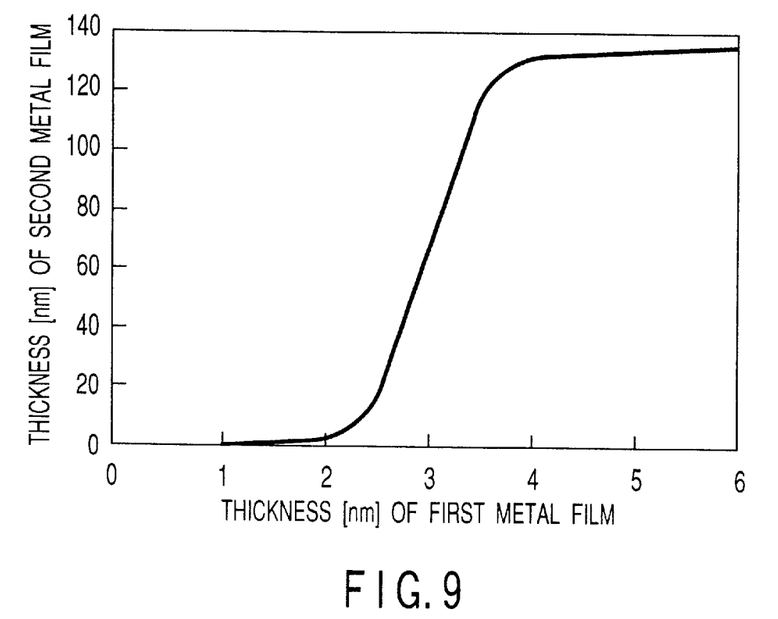
FIG. 9 is a view showing the relationship between the thickness of the first metal film and the thickness of the second metal film according to the second embodiment of the present invention.

FIG. 9 shows the measurement result indicating the thickness of the second metal film (in the case of FIG. 9, a copper film formed by electrolessplating for 10 minutes) with respect to the thickness of the first metal film (in the case of FIG. 9, a copper film formed by sputtering). In the case of FIG. 9, under the first metal film, a barrier metal film is formed on a silicon oxide film.

As is apparent from FIG. 9, when the first metal film does not exist or is very thin, the second metal film is not substantially formed. When the thickness of the first metal film becomes almost 3 nm or more, film formation of the second metal film progresses drastically. This may be because the first metal film serves as the seed that promotes growth of the second metal film formed by electrolessplating. Note that the seed means that the first metal film serves as the source that promotes growth of the second metal film.

Therefore, if the first metal film is formed in advance, the second metal film can be effectively formed by electrolessplating. Since the second metal film is formed by electrolessplating, it has excellent step coverage, and any overhang is rarely formed in a groove or hole. Therefore, when the third metal film is formed on the second metal film by electroplating, the third metal film can be uniformly filled in the groove or hole.

In this manner, according to the present invention, a metal film having high quality can be obtained, and the electromigration resistance of the metal film can be improved.

The first metal film preferably has a thickness of 3 nm or more. Normally, the thickness of the first metal film is preferably set to 3 nm or more throughout the entire film formation region on the substrate. It is confirmed that, if the thickness of the first metal film is about 5 nm or more, the adhesion properties with the barrier metal are improved. From this viewpoint, the thickness of the first metal film is preferably about 5 nm or more.

Figure 10:
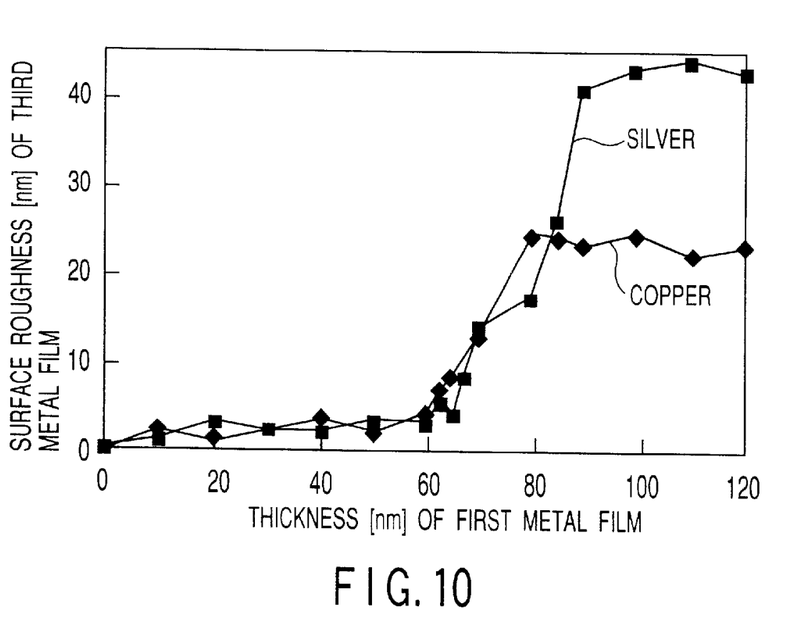
FIG. 10 is a view showing the relationship between the thickness of the first metal film and the surface roughness of the third metal film according to the second embodiment of the present invention.

FIG. 10 shows the measurement result indicating the surface roughness of the third metal film with respect to the thickness of the first metal film. FIG. 10 shows a case wherein copper is used to form the first, second, and third metal films, and a case wherein silver is used to form the first, second, and third metal films. As is apparent from FIG. 10, when the thickness of the first metal film becomes almost 70 nm or more, the surface roughness of the third metal film degrades quickly. Therefore, this value can be regarded as the upper limit of the thickness of the first metal film.

From the foregoing, the first metal film preferably has a thickness d that falls within a range of 3 (nm)≦d (nm)≦70 (nm). Normally, the thickness d is preferably set to fall within this range throughout the entire film formation region on the substrate.

Figure 11:
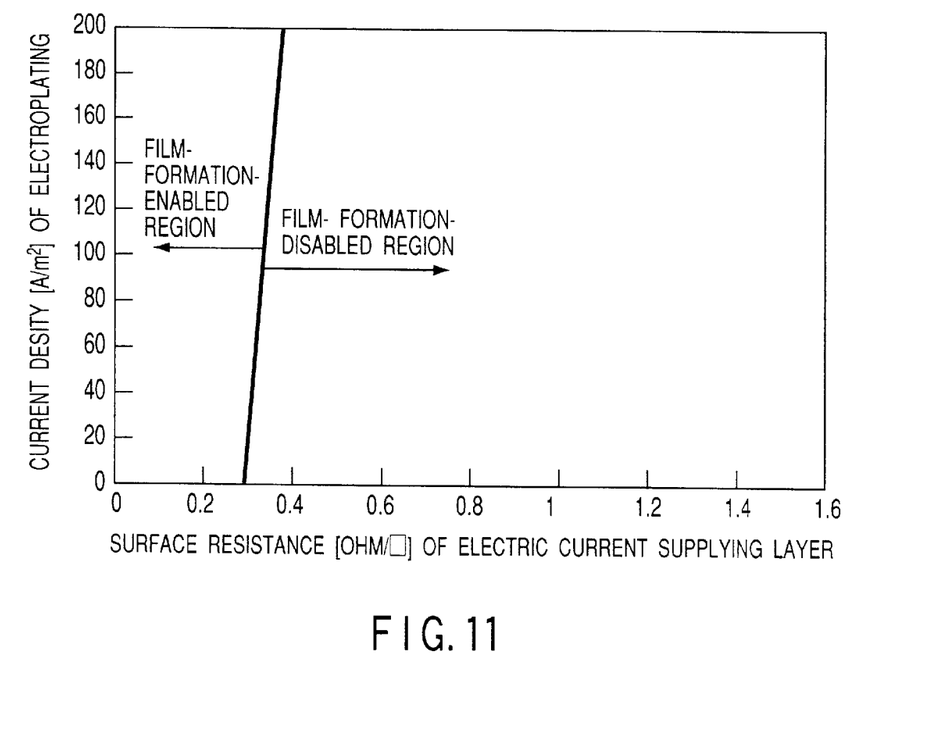
FIG. 11 is a view showing the relationship between the surface resistance of the electric current supplying layer and the current density of electroplating according to the second embodiment of the present invention.

The surface resistance obtained after formation of the second metal film will be described. In electroplating, a relatively negative potential is applied to a substrate in an electrolyte to have positive metal ions attached to the surface of the substrate. For this purpose, a conductive layer that can supply a sufficiently large current is necessary. FIG. 11 shows the current density of electroplating with respect to the surface resistance (sheet resistance) of an electric current supplying layer (in the case of FIG. 11, barrier metal film+first metal film (copper film formed by sputtering)+second metal film (copper film formed by electrolessplating)). As is apparent from FIG. 11, to grow a metal film by electroplating, the substrate formed with the first and second metal films preferably has a surface with a sheet resistance of about 0.4Ω or less before formation of the third metal film. Normally, the sheet resistance is preferably set to 0.4Ω or less throughout the entire film formation region on the substrate. If the sheet resistance exceeds this value, initial electroplating does not occur (or is very difficult to occur), making it very difficult to fill the third metal film in the groove or hole.

After formation of the first metal film before formation of the second metal film, or after formation of the second metal film before formation of the third metal film, denatured layers composed of an oxide or the like may be undesirably formed at the interfaces among these metal films. To prevent this, the surface of the first metal film may be etched after formation of the first metal film before formation of the second metal film. Alternatively, the surface of the second metal film may be etched after formation of the second metal film before formation of the third metal film. From the viewpoint of suppressing formation of the denatured layer, the substrate is not preferably exposed to the atmosphere after formation of the second metal film is started before formation of the third metal film is ended.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The preferred embodiments of the present invention will be described in detail with reference to the accompanying drawings.

(First Embodiment)

Formation of a copper film by electrolessplating will be described as the first example of this embodiment with reference to FIGS. 1 to 3.

Figure 1:
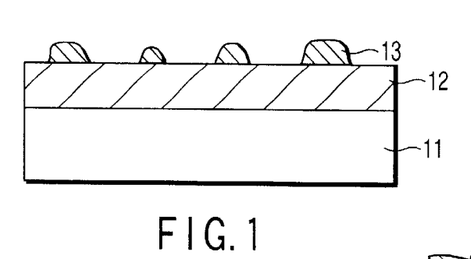
FIG. 1 is a view showing part of a manufacturing step according to the first example of the first embodiment of the present invention.

As shown in FIG. 1, a tantalum nitride (TaN) film 12 (thickness: 20 nm) is formed as the first metal film on a silicon substrate 11 formed with desired devices. This tantalum nitride film 12 is formed by sputtering using a collimator. More specifically, a tantalum target is sputtered in an atmosphere consisting of argon and nitrogen gas. The tantalum nitride film 12 is uniformly formed on the silicon substrate 11 as a continuous film.

Subsequently, a copper film 13 (average thickness: about 1 nm) is formed by sputtering as the second metal film. More specifically, the substrate temperature is set to 400° C., and a copper target is sputtered at a low film deposition rate within a short period of time. The copper film 13 on the tantalum nitride film 12 agglomerates due to the surface tension to form island-like discontinuous films. This is confirmed by surface observation using an electron microscope.

Figure 2:
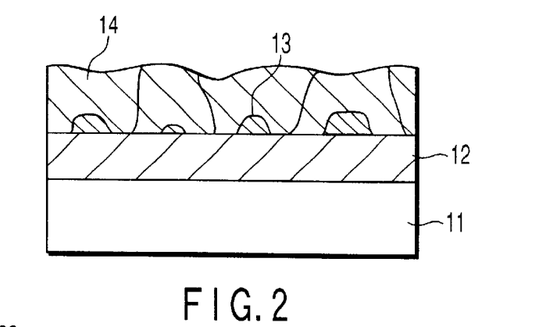
FIG. 2 is a view showing part of a manufacturing step according to the first example of the first embodiment of the present invention.
Figure 3:
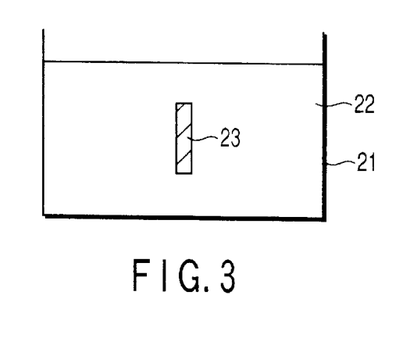
FIG. 3 is a view showing an electrolessplating step according to the first example of the first embodiment of the present invention.

As shown in FIG. 2, a copper film 14 is formed as the third metal film by electrolessplating. As shown in FIG. 3, a substrate 23 formed with the tantalum nitride film 12 and copper film 13 is immersed in a plating solution 22 in a plating tank 21 to form the copper film 14. As the plating solution, an aqueous solution of copper sulfate containing formalin as a reducing agent is used. The copper film 14 grows more preferentially on the copper film 13 than on the tantalum nitride film 12. Accordingly, only the copper film 13 substantially serves as the nucleus for growth of the copper film 14. A problem of interference of mutual crystal growth due to the neighboring deposition films during growth of the copper film 14 is prevented. As a result, the copper film 14 was formed to have a very large grain size (1,000 nm to 2,500 nm).

The copper plating film formed in this manner has a high reliability and low resistivity, which are excellent characteristics as a wiring. When a copper plating film was formed on the tantalum nitride film 12 without forming discontinuous copper films 13, the adhesion strength of the film was very poor. When the discontinuous copper films 13 were formed by sputtering as in this example, the adhesion strength was also improved.

Formation of a copper film by electroplating will be described as the second example of this embodiment with reference to FIGS. 4 to 6.

Figure 4:
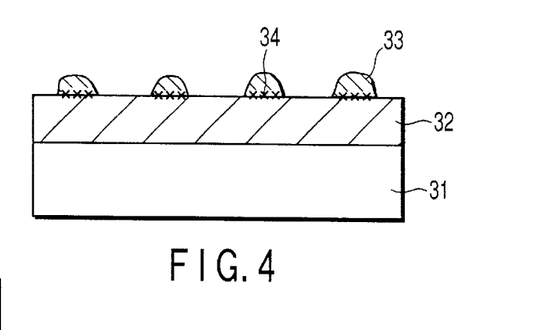
FIG. 4 is a view showing part of a manufacturing step according to the second example of the first embodiment of the present invention.

As shown in FIG. 4, a silver film 32 (thickness: 100 nm) is formed as the first metal film on a silicon substrate 31 formed with desired devices. More specifically, this silver film 32 is formed by sputtering a silver target in an argon atmosphere. The silver film 32 is uniformly formed on the silicon substrate 31 as a continuous film. The silver film 32 serves as a conductive film that supplies a current to the substrate during electroplating.

Subsequently, a palladium film 33 (average thickness: about 2 nm) is formed by sputtering as the second metal film. More specifically, a palladium target is sputtered at a low film deposition rate within a short period of time. The palladium film 33 on the silver film 32 forms island-like discontinuous films. This is confirmed by surface observation using an electron microscope. After that, the resultant substrate is annealed at 500° C. for 60 min in vacuum to cause an alloy reaction between part of silver in the silver film 32 and part of palladium in the palladium film 33. Namely, a solid solution of silver and palladium is formed. Since an alloy 34 is formed, a high adhesion strength can be obtained between the silver film 32 and palladium film 33.

Figure 5:
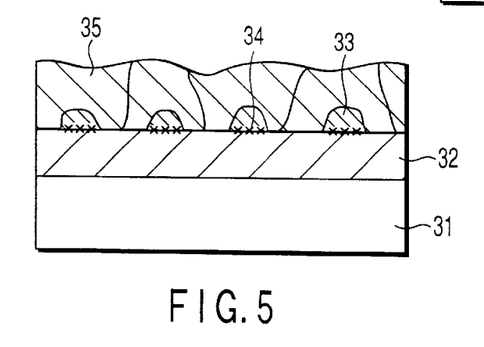
FIG. 5 is a view showing part of a manufacturing step according to the second example of the first embodiment of the present invention.

As shown in FIG. 5, a silver film 35 is formed as the third metal film by electroplating in the following manner.

Figure 6:
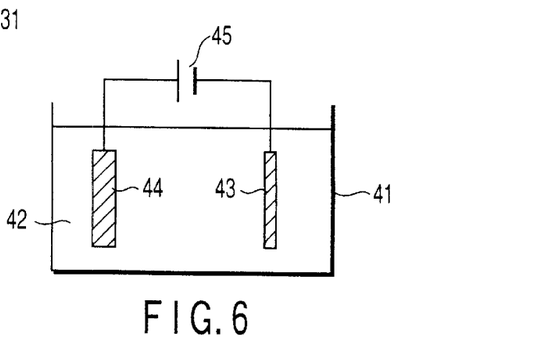
FIG. 6 is a view showing an electroplating step according to the second example of the first embodiment of the present invention.

As shown in FIG. 6, a substrate 43 formed with the silver film 32 and palladium film 33 is dipped in a plating solution 42 (silver nitrate-based solution) in a plating tank 41. A silver plate 44 serving as an anode is also dipped in the plating solution 42 to oppose the substrate 43. In this state, negative and positive potentials are applied from a power supply 45 to the substrate 43 and silver plate 44, respectively, to flow a current between them (current density: 0.1 A/cm$^2$). When electroplating of silver is initiated in this manner, silver is preferentially precipitated where the palladium film 33 is present due to the catalyst function of palladium. A problem of interference of mutual crystal growth due to the neighboring deposition films during growth of the silver film 35 is prevented. As a result, the silver film 35 was formed to have a very large grain size (500 nm to 2,000 nm).

The third example of this embodiment will be described with reference to FIGS. 7A and 7B. In this example, discontinuous films serving as the second metal film are formed by utilizing the step formed on the substrate surface.

Figure 7A:
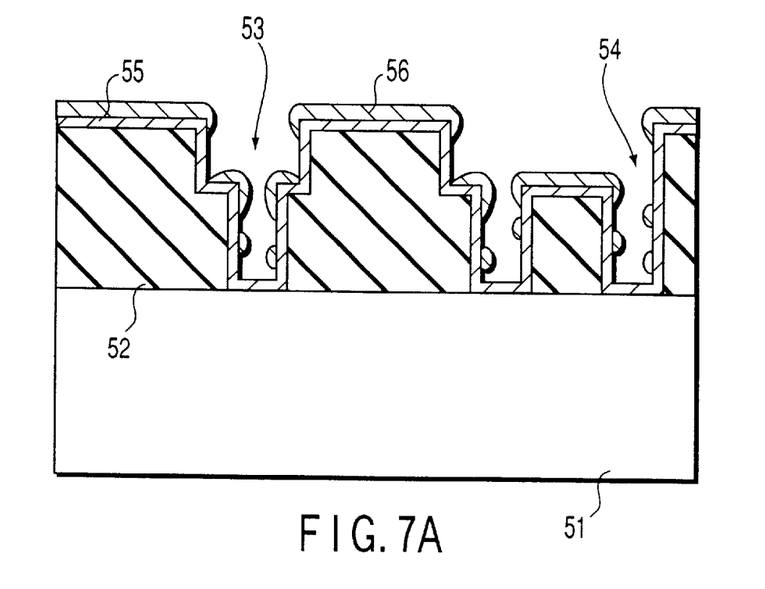
FIGS. 7A and 7B are views showing manufacturing steps according to the third example of the first embodiment of the present invention.

As shown in FIG. 7A, an insulating film 52 is formed on a silicon substrate 51 formed with desired devices. Subsequently, a wiring groove 53 and a connection hole 54 are formed in the insulating film 52. After that, a titanium nitride film 55 is formed by CVD as the first metal film. CVD allows forming a continuous film even if the substrate surface has a step. With CVD, a gas is thermally decomposed at the substrate surface to form a film. As a result, good step coverage can be obtained.

A copper film 56 is formed as the second metal film by sputtering. With sputtering, metal from the metal target comes straightly to the substrate surface, and sufficiently good step coverage cannot be obtained in the groove 53 and connection hole 54. Accordingly, the copper film 56 forms discontinuous films on the side wall or bottom of the groove 53 and connection hole 54.

Figure 7B:
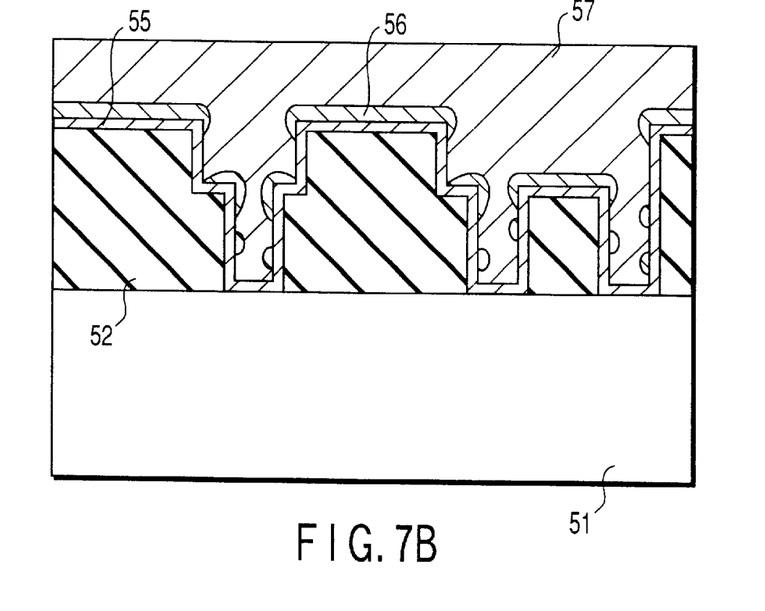

As shown in FIG. 7B, a copper film 57 is formed as the third metal film by electroplating or electrolessplating. The copper film 57 having a large crystal grain size can be formed in the same manner as in the first and second examples described above. After that, an excessive film is removed by CMP or the like to selectively leave the copper film 57 and the like in the groove 53 and connection hole 54.

(Second Embodiment)

The first example of this embodiment will be described in detail with reference to the manufacturing steps shown in FIGS. 8A to 8D.

Figure 8A:
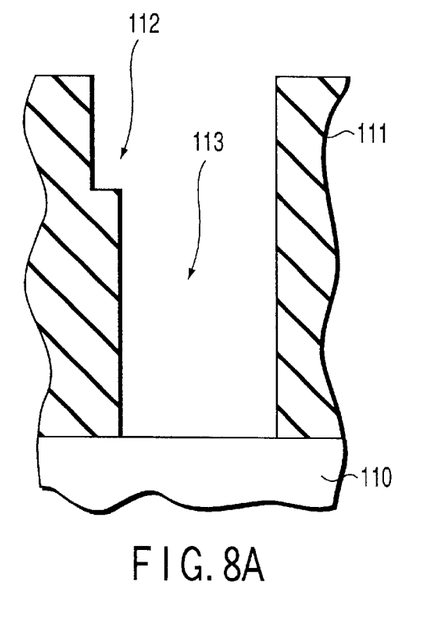
FIGS. 8A to 8D are views showing manufacturing steps according to the second embodiment of the present invention.

First, as shown in FIG. 8A, a fluorine-doped silicon oxide film is formed as an interlayer insulating film 111 on a silicon substrate 110 formed with active elements ouch as transistors. Subsequently, a wiring groove 112 and a connection hole 113 are formed by photolithography and dry etching.

Figure 8B:
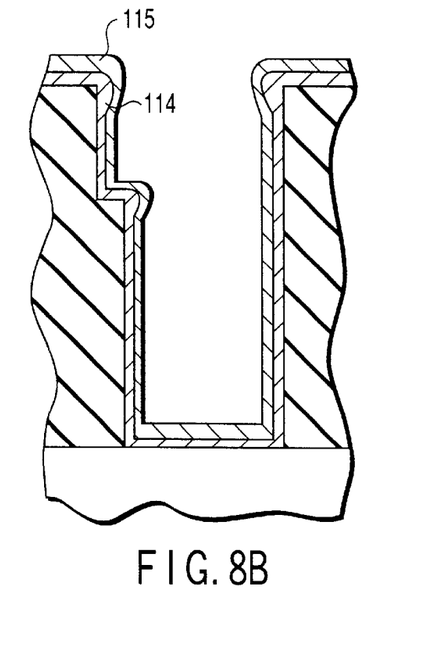

As shown in FIG. 8B, a tantalum nitride film (thickness: 20 nm) that forms a barrier metal film 114 is formed by reactive ion sputtering. It is confirmed through experiments that a copper film is not directly formed on the tantalum nitride film by electrolessplating. After that, a copper film (thickness: 20 nm) that forms a first metal film 115 is formed by sputtering. With this film thickness, an overhang is almost negligible. The thickness of the copper film 115 became the minimum on the side wall near the bottom of the connection hole 113, which was 3.5 nm.

Figure 8C:
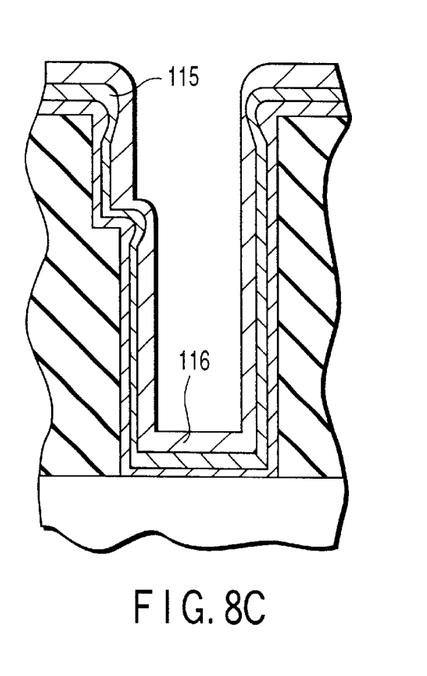

As shown in FIG. 8C, a copper film (thickness: 80 nm) that forms a second metal film 116 is formed by electrolessplating. At this time, the copper film 115 serves as the seed for the copper film 116. With electrolessplating, a comparatively uniform film deposition rate can be obtained in grooves and holes as well. Both the resistivity of the copper film formed by electrolessplating and that of the copper film formed by Sputtering are about 2 $\mu\Omega$·cm. Accordingly, the surface resistance (sheet resistance) of the copper films (3.5 nm as thickness of the copper film 115+76 nm as thickness of the copper film 116=79.5 nm as total thickness) formed on the side wall near the bottom of the connection hole is:

$$2\mu\Omega\cdot cm/79.5\times 10^{-7}\ cm = 0.125\Omega$$

As the electrolessplating solution, a copper sulfate solution containing formaldehyde as a reducing agent is used.

Figure 8D:
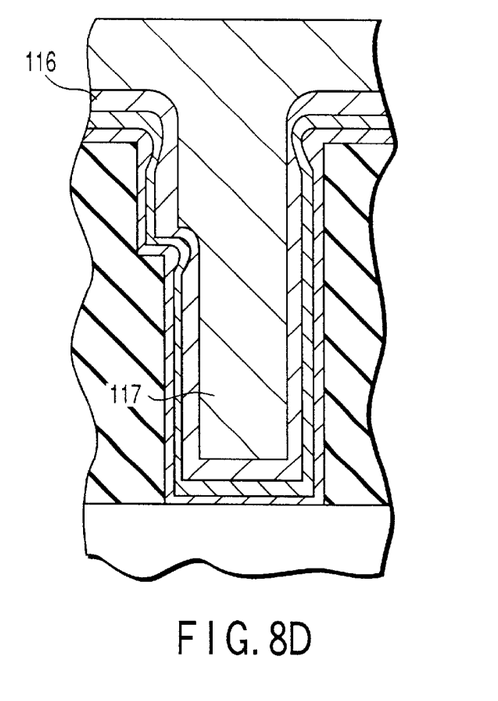

As shown in FIG. 8D, a copper film that forms a third metal film 117 is formed to a thickness of 800 nm by electroplating. In this electroplating, the tantalum nitride film 114 and the copper films 115 and 116 serve as an electric current supplying layer for electroplating. As the electroplating solution, one obtained by adding hydrochloric acid as a pH control agent to a copper sulfate solution can be used. The copper film 117 was uniformly filled in the connection hole having a diameter of 0.2 $\mu$m and a depth of 1.2 $\mu$m without forming a void or seam.

After the above steps, polishing is performed by, e.g., CMP, to selectively leave a wiring copper film in the wiring groove and connection hole.

In the above example, copper is used to form the first, second, and third metal films 115, 116, and 117. However, the present invention is not limited to this, and a material and thickness necessary for the wiring forming process can be appropriately selected.

For example, it is possible to use a titanium nitride film (thickness: 15 nm) formed by CVD as the barrier metal film 114, a nickel film (thickness: 25 nm) as the first metal film 115, a platinum film (thickness: 80 nm) as the second metal film 116, and a silver film (thickness: 1,200 nm) as the third metal film 117. In this case, an aqueous solution of platinum chloride can be used as the plating solution for electrolessplating of platinum, and an aqueous solution of silver nitrate can be used as the plating solution for electroplating of silver. It is also possible to use an alloy to form the first metal film so that the electric surface resistance after the second metal film is formed is decreased.

The second example of this embodiment will be described in detail. This description will be made with reference to FIGS. 8A to 8D.

First, as shown in FIG. 8A, a fluorine-doped silicon oxide film is formed as an interlayer insulating film 111 on a silicon substrate 110 formed with active elements such as transistors. Subsequently, a wiring groove 112 and a connection hole 113 are formed by photolithography and dry etching.

As shown in FIG. 8B, a tantalum nitride film (thickness: 20 nm) that forms a barrier metal film 114 is formed by reactive ion sputtering. After that, a copper film (thickness: 20 nm) that forms a first metal film 115 is formed by sputtering.

The steps up to this step are identical to those of the first example.

The flow advances to the step shown in FIG. 8C. First, the substrate is dipped in a plating tank filled with pure water. Subsequently, sulfuric acid is gradually added to the pure water in the plating tank to finally reach a concentration of 0.5N, and this state is held for 5 min. Hence, a denatured layer (composed of an oxide or a sulfide) formed on the surface of the copper film 115 is removed by etching. If the substrate is taken out and exposed to the atmosphere, a surface denatured layer may be formed again. For this reason, the substrate is kept held in the solution.

Dilute sulfuric acid including copper eluting from part of the copper film 115 is substituted with pure water, and the pure water is then substituted with an electrolessplating solution (one identical to that used in the first example is used). During this process as well, the substrate is not exposed to the atmosphere but is held in the solution. A copper film that forms a second metal film 116 is formed on the copper film 115 by electrolessplating.

After the copper film 116 is formed, the electrolessplating solution is substituted with pure water, and the pure water is then substituted with an electroplating solution (one identical to that used in the first example is used). When the substrate is held in the electroplating solution, the surface of the copper film 116 is etched, and a surface denatured layer composed of an oxide and the like is removed.

After that, a negative potential is applied to the substrate, and a copper film that forms a third metal film 117 is formed by electroplating, as shown in FIG. 8D. Immediately before electroplating is ended, the electroplating solution is substituted with pure water to wash the substrate.

In this manner, according to this example, a series of plating and water washing are entirely performed without exposing the substrate to the atmosphere. This enables formation of metal films without forming denatured layer at the interfaces among the respective films. Metal films obtained in this manner are excellent in terms of crystallinity and degree of purity of the films. This tendency is particularly conspicuous when metal films made of the same material are continuously formed (the same material need not always be used). To improve the efficiency of water washing and solution substitution, it is effective to vibrate the plating tank or introducing a jet into the plating tank.

In this example as well, metal materials other than copper can be appropriately selected to form the first, second, and third metal films, as a matter of course.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A film formation method for manufacture of a semiconductor device, comprising:

forming a first metal film as a continuous film on a substrate having a concave portion formed of at least one of a groove and a hole;

forming a second metal film on the substrate with the first metal film thereon, the second metal film including at least one discontinuous nucleus on the first metal film in the concave portion; and forming a third metal film by plating on the substrate with the first and second metal films thereon, the third metal film being buried into the concave portion with the first and second films.

2. A method according to claim 1, wherein the first, second, and third metal films are made of metal materials selected such that the third metal film is more preferentially formed on the second metal film than on the first metal film.

3. A method according to claim 1, wherein the second and third metal films are made of a same metal material.

4. A method according to claim 1 wherein the discontinuous nucleus is obtained by depositing a metal material on the substrate with the concave portion.

5. A method according to claim 4, wherein the metal material is deposited by sputtering.

6. A film formation method for manufacture of a semiconductor device, comprising:

forming a first metal film as a continuous film on a substrate;

forming a second metal film as discontinuous films on the substrate formed with the first metal film;

forming a third metal film by plating on the substrate formed with the first and second metal films; and causing an alloy reaction between a metal constituting the first metal film and a metal constituting the second metal film prior to formation of the third metal film.

7. A method according to claim 1, wherein the third metal film is formed by electroplating, and the first metal film is used as an electrode when forming the third metal film by electroplating.

8. A method according to claim 1, wherein the second metal film includes a plurality of nuclei in the concave portion formed with the first metal film.

9. A film formation method for manufacture of a semiconductor device, comprising:

forming a first metal film that serves as a seed in electroless plating on a substrate having a concave portion formed of at least one of a groove and a hole;

forming a second metal film by electroless plating on the substrate with the first metal film thereon; and forming a third metal film by electroplating on the substrate with the first and second metal films thereon, the third metal film being buried into the concave portion with the first and second metal films, wherein the substrate with the first and second metal films thereon has a surface with a sheet resistance of not more than $0.4\Omega$ before formation of the third metal film.

10. A method according to claim 9, wherein the first and second metal films are made of a same metal material.

11. A method according to claim 9, wherein the second and third metal films are made of a same metal material.

12. A method according to claim 9, wherein the first metal film has a thickness d that falls within a range of $3\text{ (nm)} \leq d\text{ (nm)} \leq 70\text{ (nm)}$.

13. A method according to claim 9, further comprising etching a surface of the first metal film after formation of the first metal film and before formation of the second metal film.

14. A method according to claim 9, further comprising etching a surface of the second metal film after formation of the second metal film and before formation of the third metal film.

15. A method according to claim 9, wherein the substrate is not exposed to the atmosphere after the formation of the second metal film is started and before the formation of the third metal film is ended.

* * * * *